United States Patent
Zumkehr et al.

(10) Patent No.: US 7,152,008 B2
(45) Date of Patent: Dec. 19, 2006

(54) CALIBRATED DIFFERENTIAL VOLTAGE CROSSING

(75) Inventors: John F. Zumkehr, Orange, CA (US); James E. Chandler, Mission Viejo, CA (US); Renjeng Chiang, Cerritos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/013,255

(22) Filed: Dec. 15, 2004

(65) Prior Publication Data
US 2006/0116839 A1    Jun. 1, 2006

(51) Int. Cl.
*G01R 35/00* (2006.01)
*G06F 19/00* (2006.01)

(52) U.S. Cl. .......................... 702/106; 702/72; 702/74

(58) Field of Classification Search ................. 702/65, 702/69, 72, 74, 106; 327/108, 153, 154, 327/158, 291, 147, 149; 365/191, 194; 324/76.77, 324/76.78; 370/516–518; 375/147, 148
See application file for complete search history.

(56) References Cited

U.S. PATENT DOCUMENTS

| | | | | |
|---|---|---|---|---|
| 5,672,991 A | * | 9/1997 | Thoma et al. | 327/239 |
| 6,011,732 A | * | 1/2000 | Harrison et al. | 365/194 |
| 6,526,113 B1 | * | 2/2003 | Gutierrez et al. | 375/376 |

* cited by examiner

*Primary Examiner*—Bryan Bui
(74) *Attorney, Agent, or Firm*—Ryder IP Law, PC; Douglas J. Ryder (57) ABSTRACT

In general, in one aspect, the disclosure describes an apparatus for calibrating signals. The apparatus includes a receiver pair to receive a differential signal and a reference signal and to generate at least one comparison signal reflecting where a first signal of the differential signal and a second signal of the differential signal cross each other with respect to the reference signal. The second signal is a negative compliment of the first signal. The apparatus further includes a phase detector to determine a phase error based on the at least one comparison signal. The apparatus also includes an edge delay control driver pair to adjust the differential signal based on the phase error.

21 Claims, 10 Drawing Sheets

CALIBRATED DIFFERENTIAL VOLTAGE CROSSING

BACKGROUND

Different techniques have been used to transfer data to and from memory (e.g., Synchronous Dynamic Random Access Memory (SDRAM)). One technique for transferring data to and from memory is Double Data Rate (DDR). DDR transfers data to and/from memory on leading and trailing edges of a clock signal or signals.

Differential clock signals are often used in DDR devices. The differential clock signals include a clock signal (e.g., CK and DQS) and its negative complement (e.g., CK# and DQS#). The differential clock signals generally have synchronized, opposite phases, so as one transitions from high-to-low, the other transitions from low-to-high, and they cross each other. To have adequate timing margin on writes to memory, the differential clock signals must meet a voltage input crossing (VIX) that is fairly tight. Ideally the transition crossing should occur within a certain VIX window usually centered about a reference point (VREF.) If the transition crossing does not occur within the VIX window, a timing penalty may occur and thus memory speed may be impaired.

Some type of voltage output crossing (VOX) control may be used to attempt to provide signals having transition crossings within the VIX window, but process, voltage, and/or temperature (PVT) driver timing variations may make it difficult to consistently maintain transition crossings within VIX limitation. For example, one method to maintain VOX control is to attempt to match all driver paths within the driver such that the clock to output (Tco) of a rising transition matches that of falling transition. This method fails because while it is possible to maintain the VOX at one PVT, the VOX may vary and not be within limits at other PVTs.

Modification of slew rate, through a process monitor, of the high-to-low and low-to-high transitions, has also been used to attempt to consistently maintain transition crossings within the VIX window. However, this method is often less than consistently accurate, for any number of reasons, including its potential for undesirably affecting signal integrity.

BRIEF DESCRIPTION OF THE DRAWINGS

The features and advantages of the various embodiments will become apparent from the following detailed description in which.

DETAILED DESCRIPTION

Figure 1:
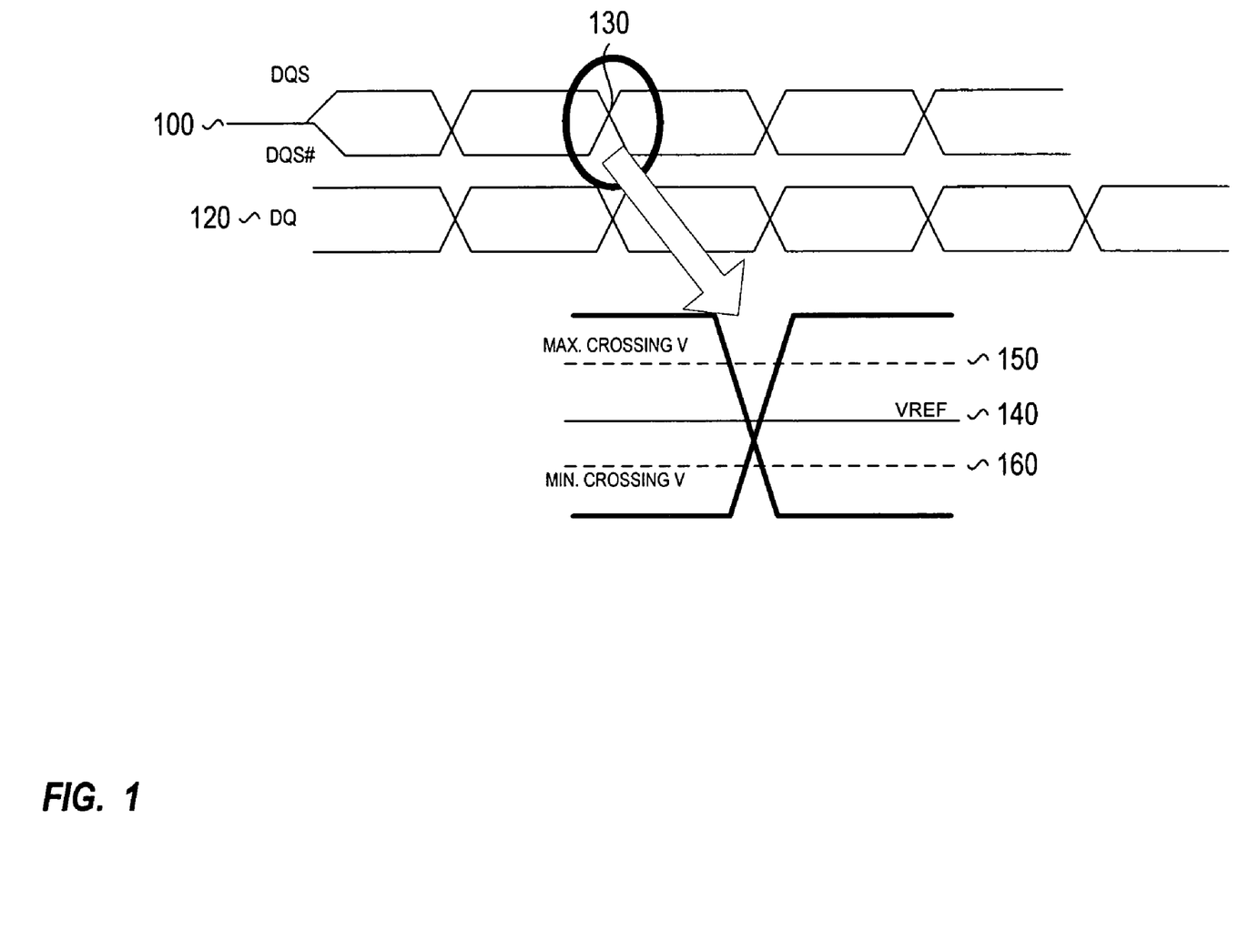
FIG. 1 illustrates an exemplary timing diagram for clocking data in and out of a Double Data Rate (DDR) memory, according to one embodiment.

FIG. 1 illustrates an exemplary timing diagram for clocking data in and out of a Double Data Rate (DDR) memory. The timing diagram includes a differential clock signal 100 and data (DQ) 120. The differential clock signal 100 includes clock signal (DQS) and its negative complement (DQS#). When DQS and DQS# cross 130 (voltage input crossing (VIX)), DQ 120 is clocked in and/or out of the DDR memory. A closer look at the crossing 130 shows a reference voltage (VREF) 140 and a maximum crossing voltage (VMAX) 150 and a minimum crossing voltage (VMIN) 160. The DQS and DQS# crossing should occur within the min/max boundaries and ideally at VREF 140. To ensure the VIX of the DDR memory occurs within the min/max boundaries and ideally at VREF 140, voltage output crossing (VOX) of a DDR driving circuit should be monitored and adjusted accordingly.

Figure 2:
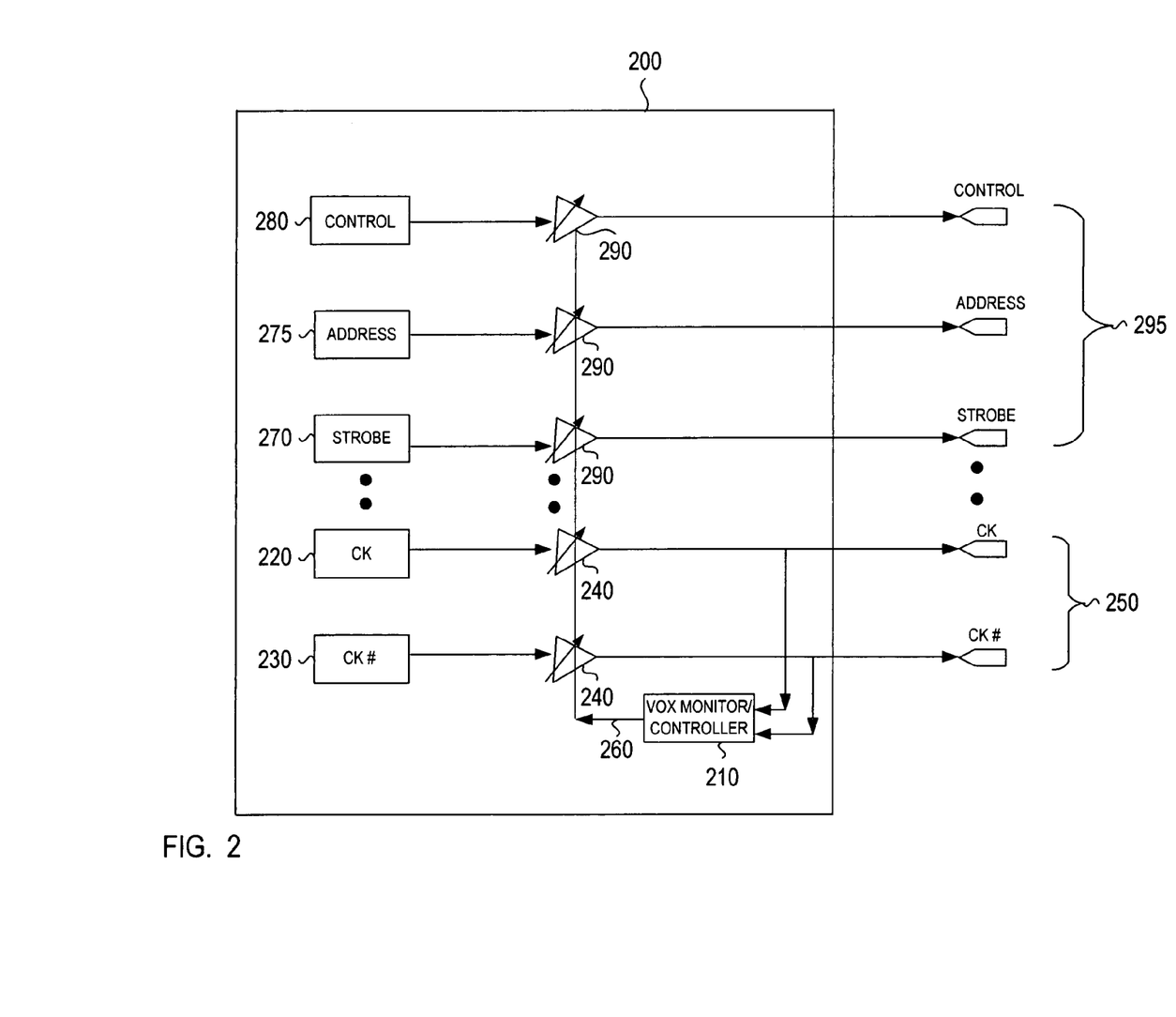
FIG. 2 illustrates an exemplary DDR driver circuit incorporating a VOX monitor/controller, according to one embodiment.

FIG. 2 illustrates an exemplary DDR driver circuit 200 incorporating a VOX monitor/controller 210. The VOX monitor/controller 210 may be dedicated to a differential clock since the clocks are always running. The DDR driver circuit 200 generates the differential clock signal that includes a first clock signal (e.g., CK) 220 and a second clock signal that is the negative complement of the first clock signal (e.g., CK#) 230. The CK and CK# signals 220, 230 are feed to drivers (edge delay control drivers) 240. Output from the drivers 240 (CK/CK#) is provided to output pads 250 (CK/CK#). The output pads 250 provide the differential clock signal to a DDR memory device for clocking data to and/or from. The output from the drivers 240 (CK/CK#) is also provided to the VOX monitor/controller 210. The VOX monitor/controller 210 monitors the VOX and generates a control signal 260 to compensate for VOX not occurring within tolerance or at VREF. The control signal 260 is provided to the drivers 240 (edge delay control drivers). The drivers 240 utilize the control signal 260 to add an appropriate amount of delay to the CK and CK# signals 220, 230 so as align the VOX.

According to one embodiment, the DDR driving circuit 200 generates multiple drive signals in addition to the differential clock signal (e.g., STROBE 270, ADDRESS 275, CONTROL 280). Each of the drive signals 270, 275, 280 is provided to a driver 290 (edge delay control driver). Each of the drivers 290 also receives the control signal 260 which adjusts the drive signals 270, 275, 280 accordingly. The adjusted drive signals are provided to output pads 295 (STROBE 270, ADDRESS 275, CONTROL 280). According to one embodiment, the drivers 290 for each of the multiple drive signals 270, 275, 280 are the same as the drivers 240 for the differential clock 220, 230. Having identical drivers allows the control signal 260 to modify all the driving signals (e.g., CK 220, CK# 230, STROBE 270, ADDRESS 275, CONTROL 280) in the same fashion. According to one embodiment, the drivers 240, 290 are standard DDR drivers.

Figure 3:
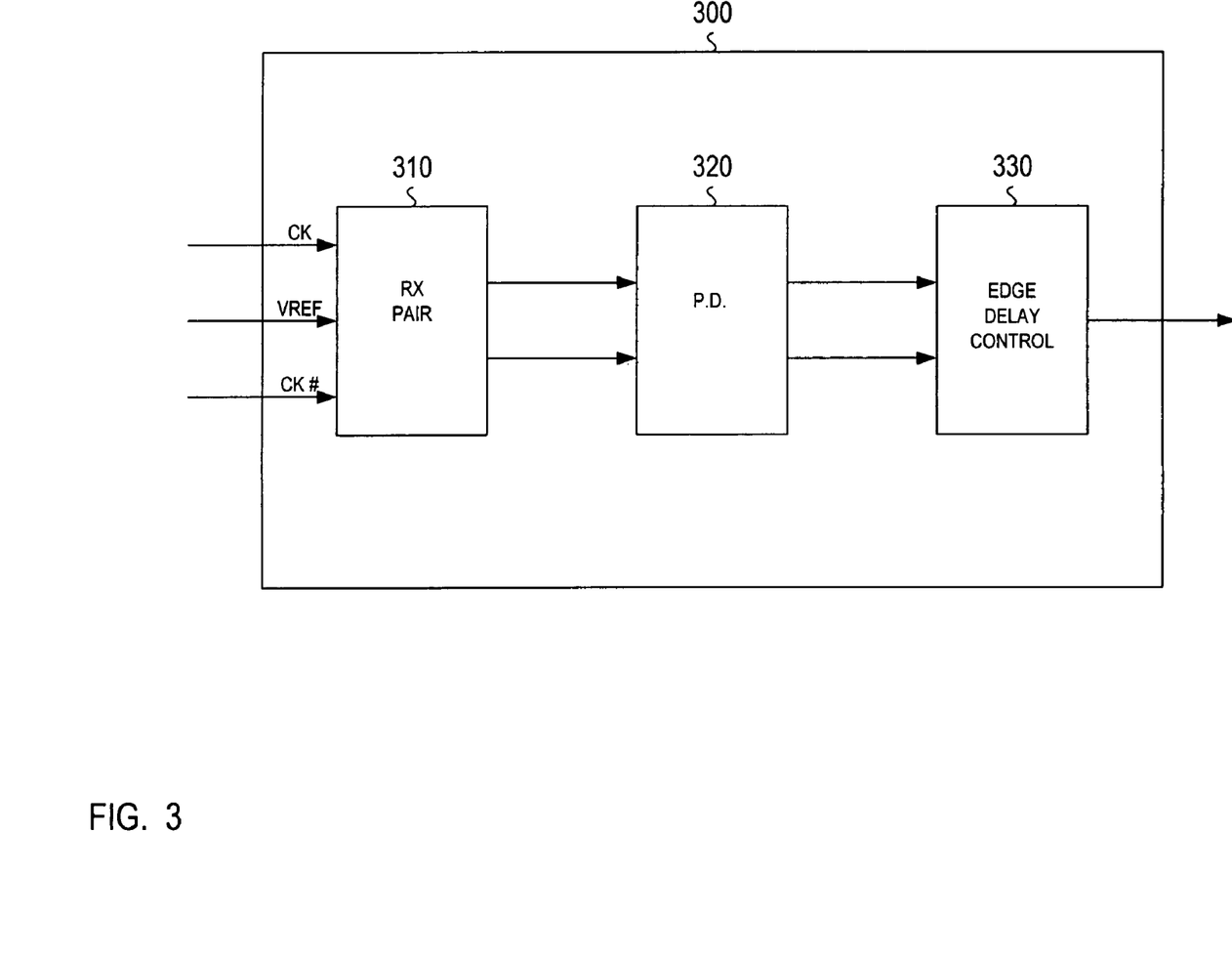
FIG. 3 illustrates a block diagram of an exemplary VOX monitor/controller, according to one embodiment.

FIG. 3 illustrates a block diagram of an exemplary VOX monitor/controller 300 (e.g., VOX monitor/controller 210). The VOX monitor/controller 300 includes receivers 310 to receive CK, CK# and VREF signals. The receivers 310 may include a pair of high speed, low offset differential comparators (receivers) that convert input levels to core logic levels. The configuration/operation of the receivers 310 will be described in more detail later. A phase detector 320 is configured to receive output signals from the receivers 310 and to compare the relative phases of the signals for phase error. The phase detector 320 may have two outputs (e.g., lead, lag) to create a phase error variable that may be proportionate to the degree of phase error. The phase error may be measured relative to CK and may be measured on the falling edge. According to alternative embodiments, the phase error may be measured relative to CK# and/or may be measured on the rising edge.

According to one embodiment, the phase error variable may take the form of a variable length output pulse, with the length varying according to amount of phase error. The phase error signal is presented to an edge delay control 330 which may convert it to a DC voltage proportional to the phase error. The edge delay control 330 may be a charge pump that includes an internal capacitor. The charge pump may be charged if the phase needs less delay (be sped up) and discharged if the phase needs more delay. Internal switches may also provide for disconnection of the charge/discharge circuit if the phase is correct, and thus the capacitor will maintain a constant voltage. According to an alternative embodiment, the charge pump may be charged if the phase needs more delay and discharged if the phase needs to less delay (be sped up).

Figure 4:
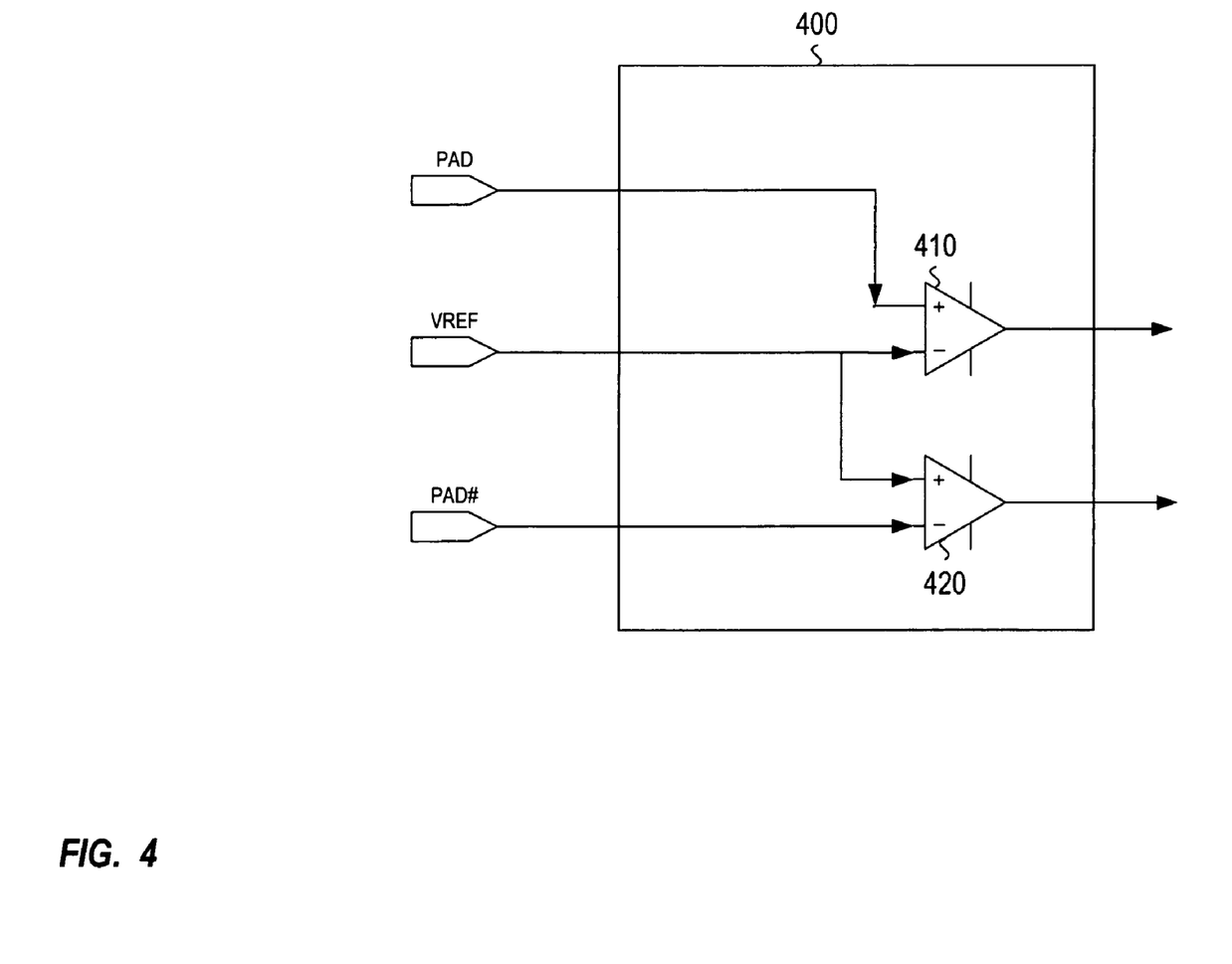
FIG. 4 illustrates an exemplary configuration of a differential receiver pair, according to one embodiment.

FIG. 4 illustrates an exemplary configuration of a differential clock receiver 400 (e.g., receivers 310). The receiver 400 receives three inputs PAD (CK), PAD# (CK#) and VREF. The receiver 400 is used to measure the cross point of the two clock signals and determine how close to VREF the clocks cross each other. The receiver 400 includes two receivers 410, 420. As previously mentioned the receivers 410, 420 may be comparators. A first receiver 410 may receive the CK signal and VREF signal and a second receiver 420 may receive the CK# and the VREF signal. The polarity of the second receiver 420 is reversed from the first receiver 410 so that the receivers 410, 420 see transitions with the same polarity. That is, the clock signal (CK) may be applied to the positive input and the VREF may be applied to the negative input on the first receiver 410, while the VREF may be applied to the positive input and the clock signal (CK#) may be applied to the negative input on the second receiver 420.

The receivers (comparators) 410, 420 may have differences between positive and negative inputs due to, for example, path differences. Accordingly, the receiver 400 may introduce errors (e.g., mismatch in the output delay for the two receivers) due to the polarity of the receivers 410, 420 being reversed.

Figure 5:
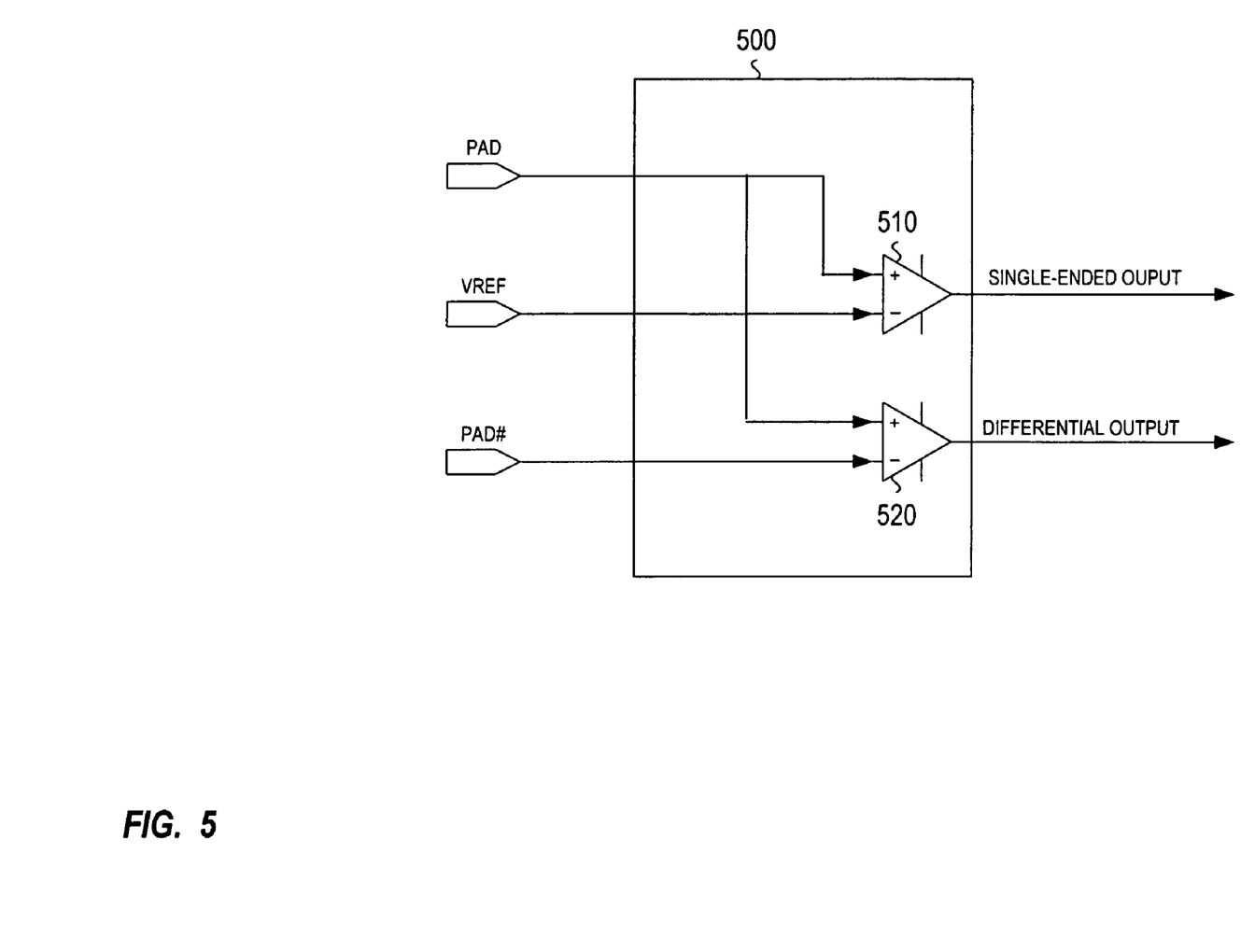
FIG. 5 illustrates an exemplary configuration of a differential receiver pair, according to one embodiment.

FIG. 5 illustrates an exemplary configuration of a differential clock receiver pair 500 (e.g., 310). The receiver 500 includes two receivers 510, 520 and receives three inputs CK, CK# and VREF. A first receiver 510 receives the CK signal and VREF signal and a second receiver 520 receives the CK and the CK# signal. Connecting the CK signal to the same input (e.g. positive) on both receivers 510, 520 avoid the mismatch in receiver delays due to input connection that may have resulted with receiver 400. The first receiver 510 (single ended comparator) flags when CK crosses the VREF and the second receiver 520 (differential comparator) flags when CK crosses CK#. The receiver 500 utilizes that fact that when balanced CK should be crossing CK# and VREF together to determine the phase difference.

The receivers 510, 520 are sensitive to input signal slew rate. Since the effective input slew rate for the differential comparator (second receiver) 520 is twice that of single ended comparator (first receiver) 510 a half gain control is used on the differential comparator 520 to provide slew rate equalization between the receivers 510, 520.

According to an alternative embodiment, CK# may be connected to the same inputs (e.g., positive) on each of the receivers 510, 520. In this alternative embodiment, the first receiver 510 (single ended comparator) would flag when CK# crosses the VREF and the second receiver 520 (differential comparator) would flag when CK# crosses CK. The receiver 500 would measure the phase difference of CK# with respect to CK.

Referring back to FIG. 3, the receiver 310 (e.g., receiver 400, 500) provides its results to the phase detector 320. The phase detector 320 determines the phase relationship between the clock signals. For example, the phase detector 320 makes a determination as to whether a falling edge of the clock signal (CK) is leading or lagging a rising edge of a negative complement clock signal (CK#). The phase comparator 320 transmits the phase error signal to the edge control delay 330 which converts the phase error signal to a DC voltage proportional to the phase error. The DC voltage is applied to the driver circuits (e.g., driver circuits 240, 290). According to alternative embodiments, the phase comparison may be made of the rising edge and/or may be made with relation to CK#.

The driver circuits adjust the signals based on the DC voltage applied. According to one embodiment, the driving circuits are the same so that applying the DC voltage makes the same adjustments to the driving signals. The adjustments may be made to all the driving signals in a DDR driving circuit. The adjustments may be made on the rising edge of the signals. It should be noted that the rising and falling edges of the signals do not necessarily align (e.g., CK and CK# are negative compliments of each other so that CK is falling while CK# is rising). Accordingly, all of the adjustments will not be made at the same time. The adjustment to CK would be made on a CK rising edge (CK# falling edge) and the adjustment to CK# would be made on a CK# rising edge (CK falling edge). According to an alternative embodiment, the adjustments to the driving signals may be made of the falling edge.

Figure 6:
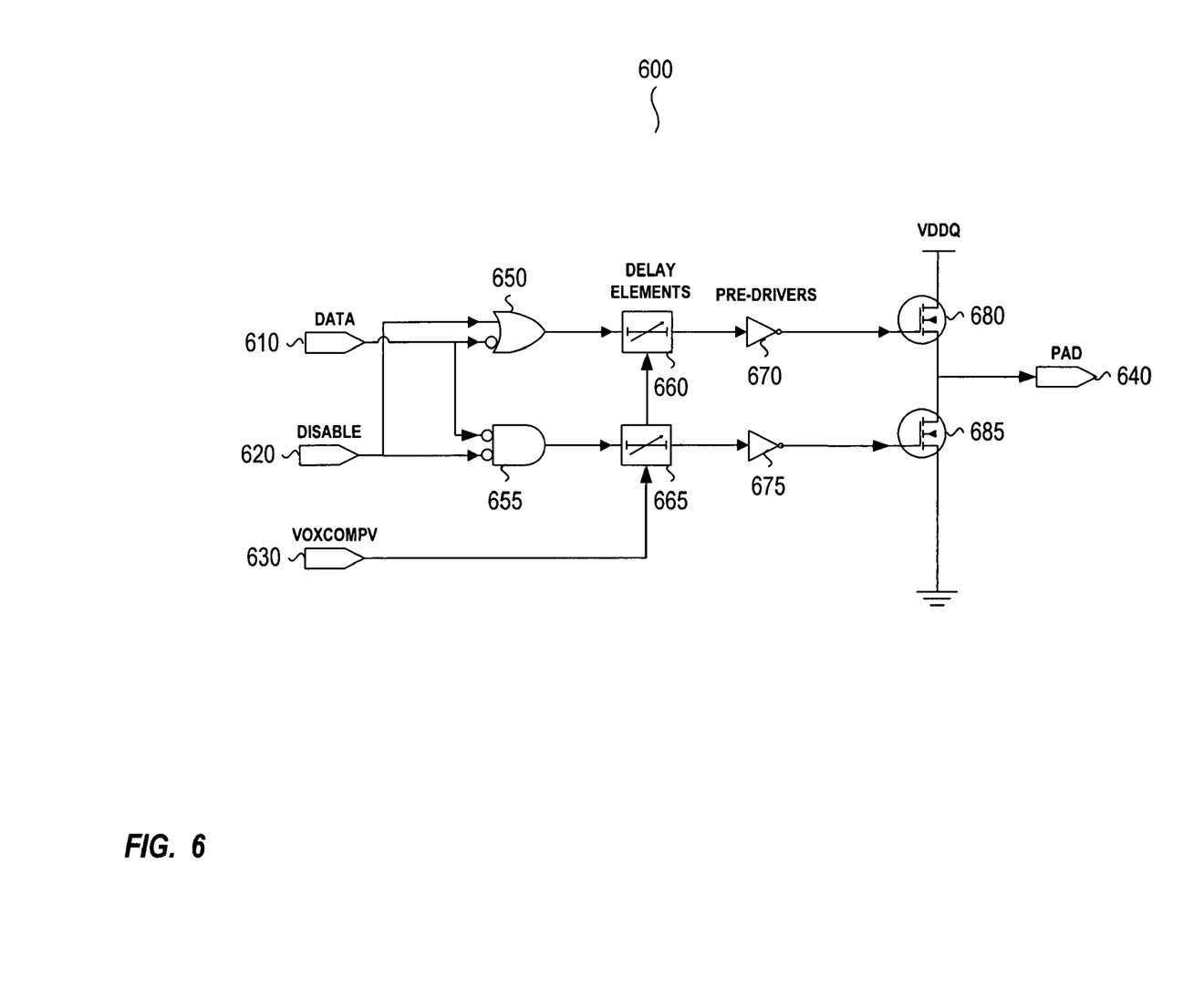
FIG. 6 illustrates an exemplary edge delay control driver, according to one embodiment.

FIG. 6 illustrates an exemplary edge delay control driver 600 (e.g., 240, 290). The driver 600 receives a data signal 610 (e.g., a clock signal such as CK or CK#), a disable signal 620 and a DC voltage proportional to the phase error (VOXCOMPV) 630. The driver 600 outputs an adjusted signal (e.g., ACK, ACK#) 640 to a PAD. The driver 600 includes an OR gate 650, an AND gate 655, a pair of delay elements 660, 665, a pair of pre-drivers 670, 675, and a pair of drivers (MOSFETs) 680, 685. The logic gates (OR and AND) 650, 655 in combination with the data 610 and disable 620 signals assist in controlling the delay elements 660, 665. A first delay element 660 controls the delay to a driver P MOSFET 680 and a second delay element 665 controls the delay to a driver N MOSFET 685. Having a delay cell in both N and P MOSFET driver paths keeps the output waveform from distorting as the delay is changed.

According to one embodiment, the driver 600 adjusts the signals on the rising edge. The driver may activate the delay elements 660, 665 for the falling clock to output (Tco) to a fixed mid-range control setting (fixed delay), while the rising Tco delay cell varies proportionately to the control voltage. Controlling the delay of the rising edge in relation to a fixed delay in the falling edge enables the rising edge to effectively be delayed or speed up. That is, if the delay elements 660, 665 delay the rising edge more than the mid-range fixed delay to the falling edge, the delay elements 660, 665 in effect delay the rising edge. Conversely, if the delay elements 660, 665 delay the rising edge less than the mid-range fixed delay to the falling edge the delay elements 660, 665 in effect is speeding up the rising edge. Applying the same delay to the rising edge as that fixed delay to the falling edge indicates that the signals are synced.

According to an alternative embodiment, the driver 600 adjusts the signals on the falling edge. The driver may activate the delay elements 660, 665 for the rising clock to output (Tco) to a fixed mid-range control setting (fixed delay), while the falling Tco delay cell varies proportionately to the control voltage.

Figure 7:
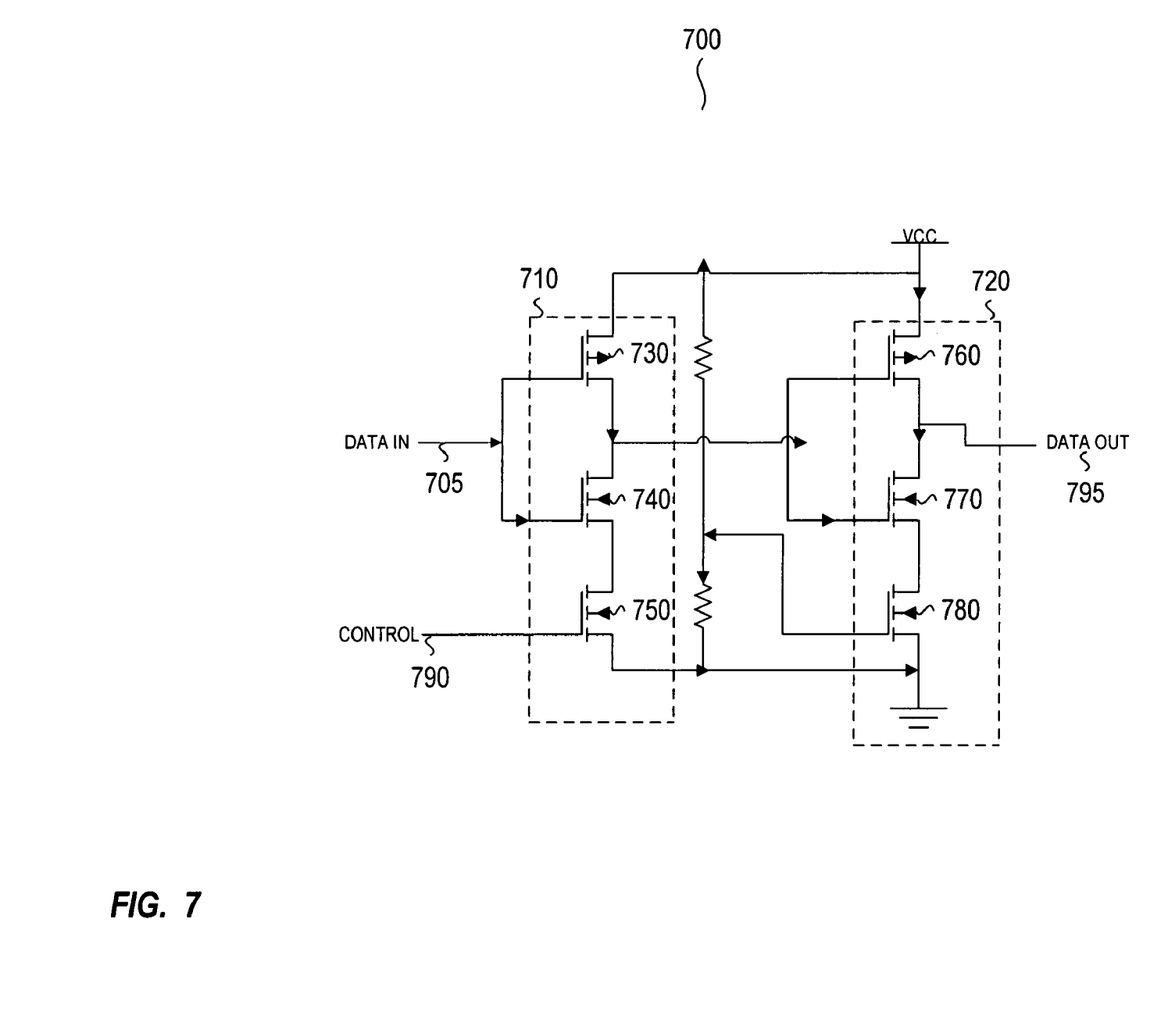
FIG. 7 illustrates an exemplary delay element of an edge delay control driver, according to one embodiment.

FIG. 7 illustrates an exemplary delay element 700 (e.g., 660, 665). The delay element 700 includes two delay cells 710, 720. A first delay cell 710 includes three transistors 730, 740, 750. The upper two transistors 730, 740 act as an inverter and the bottom transistor 750 acts as a voltage controlled current source. A second delay cell 720 includes three transistors 760, 770, 780. The upper two transistors 760, 770 act as an inverter and the bottom transistor 780 acts as a voltage controlled current source. A control signal 790 controls the transition time of the transistors 750, 780 which controls the delay of an input signal (e.g., CK) 705 and generates an output signal (e.g., delayed CK) 795. According to one embodiment, the higher the control voltage 790 the quicker the transition of the transistors 750, 780 and the less delay.

The embodiment of FIG. 7 illustrates an analog delay element in which the control voltage affects the transition time and therefore the delay. As one skilled in the art would recognize, a digital delay element would be within the scope of the various embodiments. A digital delay element may have an adjustment (e.g., linear) in delay based on a control signal. The digital delay element may adjust the delay with an adjustable delay cell, by activating different delay cells where the different delay cells equate to different delays, or by activating more or less delay cells.

Figure 8:
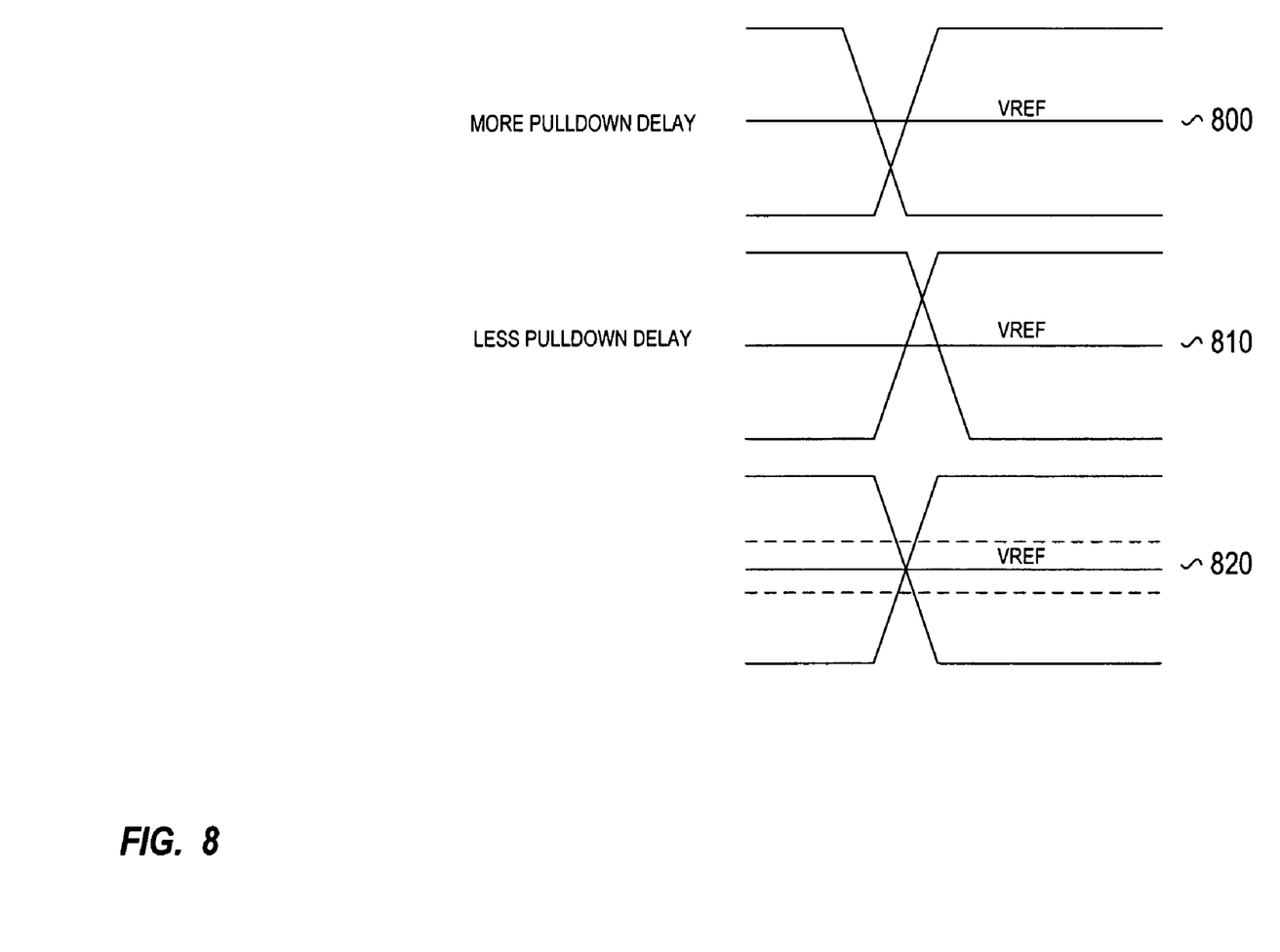
FIG. 8 illustrates exemplary VOX timing diagrams, according to one embodiment.

FIG. 8 illustrates exemplary timing diagrams having different phase errors. A first diagram 800 shows that the VOX is below VREF. Measuring the phase error on the falling edge results in an indication that the signal is leading. Adjustments may be made to the signal on the rising edge. By way of example, assume that the falling edge measures a lead of 400 pS and the fixed falling delay to be applied to the falling edge is 2 nS. The overall falling edge delay will be 1.6 nS. In order to sync the signals, the rising edge should be delayed by 1.6 nS. The overall effect of the application of the delays to the rising and falling edges is that the rising edge was sped up by 400 pS.

Referring back to FIG. 3 briefly, the edge delay control 330 may maintain a constant voltage if the phase is correct, may discharge if the phase needs to be delayed, and may charge if the phase needs to be sped up. In the above example, the rising edge needs to be sped up by 400 pS so that the edge delay control 330 may be charged by an amount that equates to removing 400 pS of delay from the standard 2.0 nS of delay resulting in a net delay applied of 1.6 nS.

A second timing diagram 810 shows that the VOX is above VREF. Measuring the phase error on the falling edge results in an indication that the signal is lagging. Adjustments may be made to the signal on the rising edge. By way of example, assume the falling edge measures a lag of 600 pS and the fixed falling delay to be applied is 2 nS. The overall falling edge delay will be 2.6 nS. In order to sync the signals, the rising edge should be delayed by 2.6 nS. The overall effect of the application of the delays to the rising and falling edges is that the rising edge was delayed by 600 pS. In this example, the edge delay control 330 of FIG. 3 may be discharged an amount that equates to adding 600 pS of delay to the standard 2.0 nS of delay resulting in a net delay applied of 2.6 nS.

A third diagram 820 shows that the VOX is at VREF (or within the window) indicating that the signals are aligned. Accordingly the delay applied to the rising edge is the same as the fixed delay applied to the falling edge. The edge delay control 330 of FIG. 3 maintains the same voltage so the mid range delay is applied to the rising Tco as well as the falling Tco.

When describing the adjustments that needed to be made to the exemplary timing diagrams 810, 820 of FIG. 8 the measurements were made on the falling edge and the adjustments were made on the rising edge but are not limited thereto. Alternative embodiments, include making the measurements on the rising edge and/or making the adjustments on the falling edge.

Figure 9:
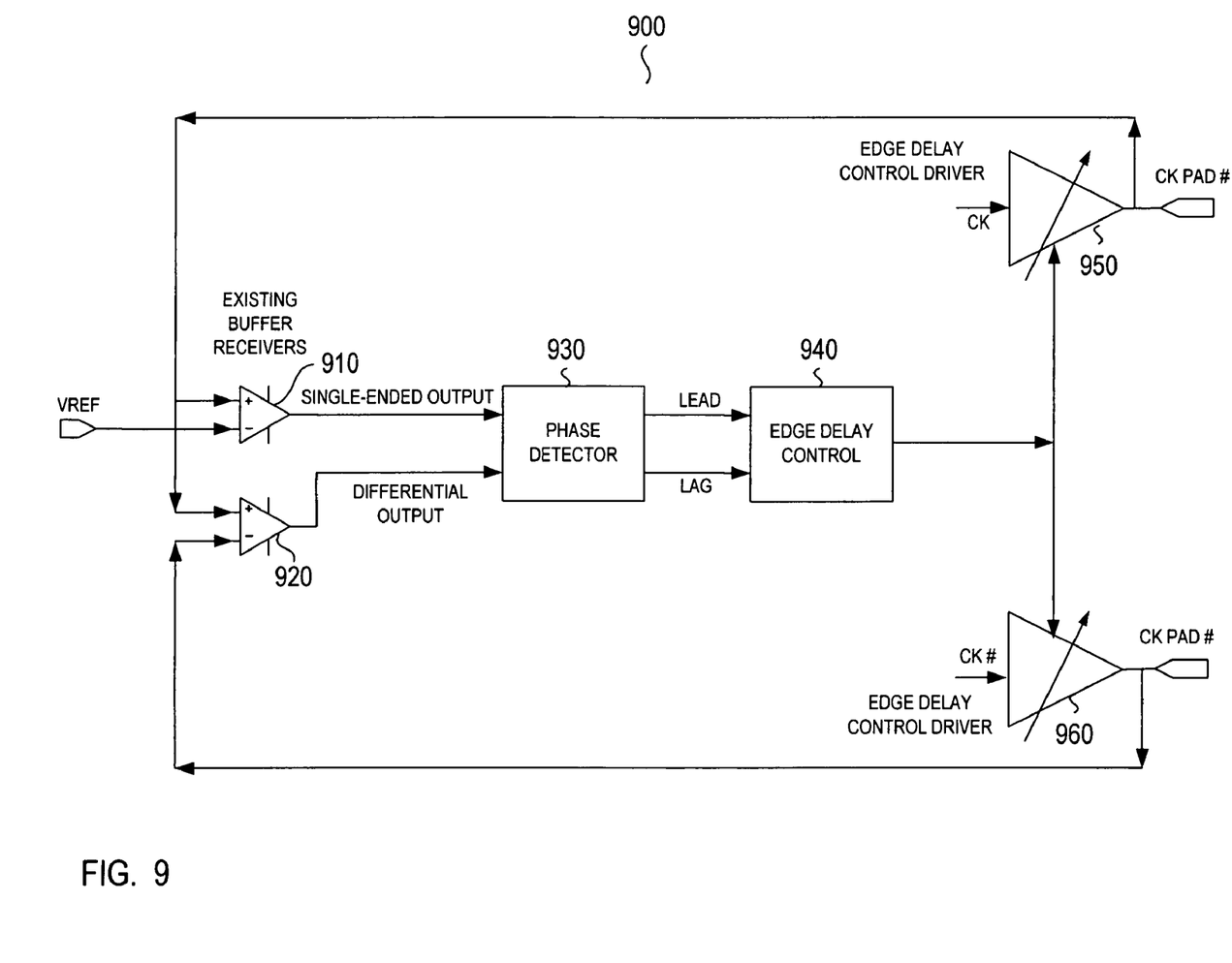
FIG. 9 illustrates a block diagram of an exemplary VOX control loop, according to one embodiment.

FIG. 9 illustrates a block diagram of an exemplary VOX control loop system 900. The system 900 includes a differential receiver pair 910, 920, a phase detector 930, an edge delay control 940, and a differential edge delay control driver pair 950, 960. A first receiver 910 receives a CK signal and a VREF signal and a second receiver 920 receives the CK signal and a CK# signal. The first receiver 910 (single ended comparator) flags when CK crosses the VREF and the second receiver 920 (differential comparator) flags when CK crosses CK#. The outputs of the receivers 910, 920 are provided to the phase detector 930 that determines whether the CK clock signal (e.g., falling edge clock signal) is leading or lagging the CK# clock signal. The lead/lag determination is provided to the edge delay control 940 that generates a DC voltage representative of the phase error. The DC voltage is applied to the driver circuits 950, 960. The driver circuits utilize the DC voltage to activate an appropriate delay in order to modify the rising edge of the clock signals (CK and CK#) if necessary.

Figure 10:
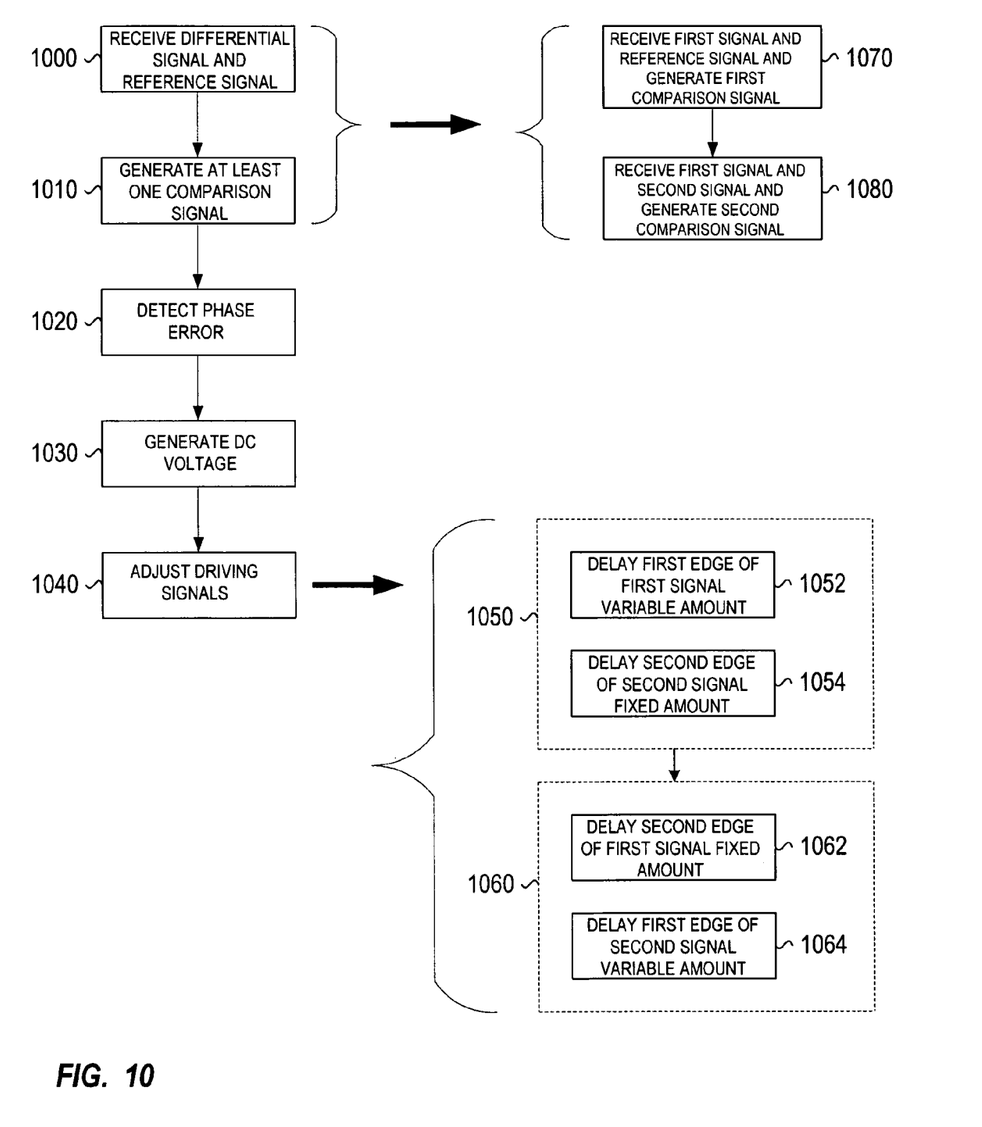
FIG. 10 illustrates an exemplary process flow for monitoring VOX and adjusting driving signals, according to one embodiment.

FIG. 10 illustrates an exemplary process flow for monitoring VOX and adjusting driving signals. A differential signal (e.g., differential clock signal) and a reference signal (e.g., a reference voltage) are received by a receiver pair 1000. The receiver pair generates at least one comparison signal based on a comparison of the differential signal and the reference signal 1010. A phase detector detects phase error based on the at least one comparison signal 1020. An edge delay control may be utilized to generate a DC voltage based on the phase error 1030. A phase error signal (e.g., the DC voltage) is provided to a plurality of edge delay control drivers to adjust associated driving signals based on the phase error 1040. The edge delay control drivers are identical for each driving signal so that all of the driving signals are adjusted the same.

The differential signals used for measuring phase error are among the driving signals adjusted. An exemplary process flow for adjustment of the differential signals is discussed. During a first crossover region 1050, a first edge of a first signal of the differential signal is delayed a variable amount in accordance with the phase error 1052 while a second edge of a second signal of the differential signal is delayed a fixed amount 1054. The second edge of the second signal is the opposite edge of the first edge of the first signal. During a second crossover region 1060, a second edge of the first signal is delayed the fixed amount 1062 while a first edge of the second signal is delayed the variable amount 1064. By adjusting the first edge of the differential signal (both first signal and second signal) a variable amount compared to the fixed amount on the second edge allows the first edge of the differential signal to be delayed, sped up or maintained. As discussed previously, the first edge may be a rising edge or may be a falling edge.

The receiving 1000 and the comparing 1010 are performed by a receiver pair (e.g., 400, 500). An exemplary process flow for utilizing a differential receiver pair (e.g., 500) is discussed. A first receiver receives a first signal (e.g., a first clock signal) and a reference signal (e.g., a reference voltage) and generates a first comparison signal 1070. A second receiver receives the first signal and a second signal that is a negative compliment of the first signal (e.g., a second clock signal) and generates a second comparison signal 1080. As previously discussed the comparison signals may be generated on a falling or rising edge of the first signal. The phase detector generates the phase error based on the first and the second comparison signals 1030.

The various embodiments described herein could be utilized in a computer system. As one skilled in the art would recognize a computer system includes processor(s) and memory and may interface to periphery, networks, the Internet, and other computer systems. The computer system may include a single die with the processor(s) and memory or may include a processor die and off die memory (e.g., a memory die). The various embodiments may be implemented as part of the memory or part of the processor(s).

Throughout the specification CK/CK# have been discussed as the signals that are used to measure and if necessary modify VOX. It should be noted that the various embodiments are not limited thereby. Rather, other signals could be used without departing from the scope. In particular other differential clock signals (e.g., DQS, DQS#) could be used.

Throughout the specification, measurements being made on the falling edge, variable adjustments being made on the rising edge and fixed adjustments being made on the falling edge have been discussed. However, as mentioned throughout the specification alternative embodiments include measuring on the rising edge, variably adjusting on the falling edge, and/or fixed adjusting on the rising edge.

According to one embodiment, the edge delay control drivers used are standard DDR edge delay control drivers and are the same for all of the driving signals. As mentioned with respect to FIG. 2, the control signal generated could be used as an input to all the driving circuits within a DDR driving circuit to adjust all the driving signals based on the VOX.

According to one embodiment, the receivers utilized are standard DDR receivers. The receivers may have different traces created but no additional pins and/or die space are required.

It should be noted the embodiments described above make specific reference to DDR driving circuits and DDR memory, but the various embodiments are not limited thereto. Rather, the various embodiments could be applied to DDR-type memory controllers, as well as other controllers using differential clock signals without parting from the current scope.

Although the various embodiments have been illustrated by reference to specific embodiments, it will be apparent that various changes and modifications may be made. Reference to "one embodiment" or "an embodiment" means that a particular feature, structure or characteristic described in connection with the embodiment is included in at least one embodiment. Thus, the appearances of the phrase "in one embodiment" or "in an embodiment" appearing in various places throughout the specification are not necessarily all referring to the same embodiment.

Different implementations may feature different combinations of hardware, firmware, and/or software. It may be possible to implement, for example, some or all components of various embodiments in software and/or firmware as well as hardware, as known in the art. Embodiments may be implemented in numerous types of hardware, software and firmware known in the art, for example, integrated circuits, including ASICs and other types known in the art, printed circuit broads, components, etc.

The various embodiments are intended to be protected broadly within the spirit and scope of the appended claims.

What is claimed is:

1. An apparatus for calibrating signals, the apparatus comprising:
   a receiver pair to receive a differential signal and a reference signal and to generate at least one comparison signal reflecting where a first signal of the differential signal and a second signal of the differential signal cross each other with respect to the reference signal;
   a phase detector to determine a phase error based on the at least one comparison signal; and
   an edge delay control driver pair to adjust the differential signal based on the phase error, wherein the adjusted differential signal is utilized to drive a device.

2. An apparatus for calibrating signals, the apparatus comprising:
   a receiver pair to receive a differential signal and a reference signal and to generate at least one comparison signal reflecting where a first signal of the differential signal and a second signal of the differential signal cross each other with respect to the reference signal, and wherein said receiver pair includes
      a first receiver to receive the first signal and the reference signal, compare the first signal and the reference signal, and provide a first comparison signal; and
      a second receiver to receive the first signal and the second signal, compare the first signal and the second signal, and provide a second comparison signal;
   a phase detector to determine a phase error based on the at least one comparison signal; and
   an edge delay control driver pair to adjust the differential signal based on the phase error, wherein the adjusted differential signal is utilized to drive a device.

3. The apparatus of claim 2, wherein said receiver pair can compare the first signal to the second signal and the reference signal on either a falling edge or a rising edge of the first signal.

4. An apparatus for calibrating signals, the apparatus comprising:
   a receiver pair to receive a differential signal and a reference signal and to generate at least one comparison signal reflecting where a first signal of the differential signal and a second signal of the differential signal cross each other with respect to the reference signal;
   a phase detector to determine a phase error based on the at least one comparison signal; and
   an edge delay control driver pair to adjust the differential signal based on the phase error, wherein said edge delay control driver pair includes a first driver to adjust the first signal and a second driver to adjust the second signal, wherein the adjusted differential signal is utilized to drive a device.

5. The apparatus of claim 4, wherein
the first driver delays a first edge of the first signal a variable amount and a second edge of the first signal a fixed amount, wherein the variable amount is based on the phase error; and
the second driver delays a second edge of the second signal the fixed amount and a first edge of the second signal the variable amount, wherein the first and second edges of the second signal are negative complements of the second and the first signal.

6. The apparatus of claim 5, wherein said edge delay control driver can effectively delay, maintain, or sped up the first edge of the differential signal by controlling the variable amount of delay on the second edge.

7. The apparatus of claim 6, wherein second edge can be either a falling edge or a rising edge.

8. The apparatus of claim 1, further comprising a voltage generator to generate a voltage based on the phase error and provide the voltage to said driver pair, wherein said voltage controls said driver pair.

9. The apparatus of claim 1, wherein the differential signal is a differential clock signal.

10. The apparatus of claim 1, further comprising at least one additional edge delay control driver to adjust an associated driving signal based on the phase error.

11. A method for calibrating signals, the method comprising:
receiving a differential signal;
comparing the differential signal and a reference signal to generate at least one comparison signal reflecting where a first signal of the differential signal and a second signal of the differential signal cross each other with respect to the reference signal;
generating a phase error signal based on the at least one comparison signal;
adjusting the differential signal based on the phase error signal; and
utilizing the adjusted differential signal to drive a device.

12. The method of claim 11, wherein said receiving includes receiving
the first signal and the reference signal at a first receiver; and
the first signal and the second signal at a second receiver.

13. A method for calibrating signals, the method comprising:
receiving a differential signal, wherein a first signal of the differential signal and a reference signal are received at a first receiver and a second signal of the differential signal and the reference signal are received at a second receiver;
comparing the differential signal and the reference signal to generate at least one comparison signal reflecting where the first signal of the differential signal and the second signal of the differential signal cross each other with respect to the reference signal, wherein said comparing includes
determining, with the first receiver, when a first edge of the first signal crosses the reference signal, and
determining, with the second receiver, when the first edge of the first signal crosses a second edge of the second signal, wherein the second edge of the second signal is opposite the first edge of the first signal;
generating a phase error signal based on the at least one comparison signal;
adjusting the differential signal based on the phase error signal; and
utilizing the adjusted differential signal to drive a device.

14. The method of claim 13, wherein said comparing can be performed on either a falling edge or a rising edge of the first signal.

15. A method for calibrating signals, the method comprising:
receiving a differential signal;
comparing the differential signal and a reference signal to generate at least one comparison signal reflecting where a first signal of the differential signal and a second signal of the differential signal cross each other with respect to the reference signal;
generating a phase error signal based on the at least one comparison signal;
adjusting the differential signal based on the phase error signal, wherein said adjusting includes delaying
a first edge of a first signal of the differential signal a variable amount based on the phase error signal; and
a second edge of a second signal of the differential signal a fixed amount, wherein the second edge of the second signal is opposite the first edge of the first signal; and
utilizing the adjusted differential signal to drive a device.

16. The method of claim 15, wherein
the delaying a first edge of a first signal is performed by a first edge delay control driver, and
the delaying a second edge of a second signal is performed by a second edge delay control driver.

17. The method of claim 15, wherein said adjusting further includes delaying
a second edge of the first signal a fixed, and
a first edge of the second signal a variable amount based on the phase error signal, wherein the first edge of the second signal is opposite the second edge of the first signal.

18. The method of claim 15, wherein the variable delay in combination with the fixed delay enables the first edge to effectively be delayed, maintained, or sped up.

19. The method of claim 15, wherein the first edge delayed by a variable amount can be either a falling edge or a rising edge.

20. The method of claim 11, wherein the differential signal is a differential clock signal.

21. The method of claim 11, further comprising providing the phase error signal to at least one additional edge delay control driver to adjust an associated driving signal based thereon.

* * * * *

UNITED STATES PATENT AND TRADEMARK OFFICE
CERTIFICATE OF CORRECTION

PATENT NO. : 7,152,008 B2  
APPLICATION NO. : 11/013255  
DATED : December 19, 2006  
INVENTOR(S) : Zumkehr et al.

It is certified that error appears in the above-identified patent and that said Letters Patent is hereby corrected as shown below:

On the face page, in field (57), under "Abstract", in column 2, line 8, delete "compliment" and insert -- complement --, therefor.

In column 4, line 35, delete "compliments" and insert -- complements --, therefor.

In column 7, line 13, delete "compliment" and insert -- complement --, therefor.

In column 9, line 10, in Claim 5, after "and" insert -- first edges of --.

In column 9, line 12, in Claim 6, after "driver" insert -- pair --.

In column 10, line 39, in Claim 17, delete "fixed," and insert -- fixed amount, --, therefor.

Signed and Sealed this

First Day of May, 2007

JON W. DUDAS  
*Director of the United States Patent and Trademark Office*